(12) United States Patent
Kim et al.

(10) Patent No.: US 11,652,101 B2
(45) Date of Patent: May 16, 2023

(54) TRENCH CAPACITOR ASSEMBLY FOR HIGH CAPACITANCE DENSITY

(71) Applicant: QUALCOMM Incorporated, San Diego, CA (US)

(72) Inventors: Jonghae Kim, San Diego, CA (US); Milind Shah, San Diego, CA (US); Periannan Chidambaram, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 164 days.

(21) Appl. No.: 17/144,411

(22) Filed: Jan. 8, 2021

(65) Prior Publication Data
US 2022/0223585 A1 Jul. 14, 2022

(51) Int. Cl.
| | | |
|---|---|---|
| *H01L 27/08* | (2006.01) | |
| *H01L 25/10* | (2006.01) | |
| *H01L 27/108* | (2006.01) | |
| *H01L 29/66* | (2006.01) | |
| *H01L 49/02* | (2006.01) | |
| *H01L 29/94* | (2006.01) | |

(52) U.S. Cl.
CPC ........ *H01L 27/0805* (2013.01); *H01L 25/105* (2013.01); *H01L 27/10829* (2013.01); *H01L 27/10838* (2013.01); *H01L 27/10861* (2013.01); *H01L 28/40* (2013.01); *H01L 28/90* (2013.01); *H01L 29/66181* (2013.01); *H01L 29/945* (2013.01)

(58) Field of Classification Search
CPC ... H01L 25/105; H01L 28/40; H01L 27/0805; H01L 27/10829; H01L 27/10861; H01L 27/10838; H01L 28/90; H01L 29/66181; H01L 29/945
See application file for complete search history.

(56) References Cited

U.S. PATENT DOCUMENTS

| | | | | |
|---|---|---|---|---|
| 2015/0145104 | A1* | 5/2015 | Bauer | ................... H01L 21/283 438/381 |
| 2016/0095221 | A1* | 3/2016 | Ramachandran | ....... H01L 23/60 361/783 |
| 2021/0305164 | A1* | 9/2021 | Tseng | ...................... H01G 4/33 |

* cited by examiner

*Primary Examiner* — Alonzo Chambliss
(74) *Attorney, Agent, or Firm* — Patterson + Sheridan LLP (57) ABSTRACT

Certain aspects of the present disclosure provide a capacitor assembly, a stacked capacitor assembly, an integrated circuit (IC) assembly comprising such a stacked capacitor assembly, and methods for fabricating the same. One exemplary capacitor assembly generally includes a first array of trench capacitors and a second array of trench capacitors. The second array of trench capacitors may be disposed adjacent to and electrically coupled to the first array of trench capacitors. Additionally, the second array of trench capacitors may be inverted with respect to the first array of trench capacitors.

12 Claims, 8 Drawing Sheets

TRENCH CAPACITOR ASSEMBLY FOR HIGH CAPACITANCE DENSITY

BACKGROUND

Field of the Disclosure

Certain aspects of the present disclosure generally relate to electronic components and, more particularly, to a capacitor assembly.

Description of Related Art

A continued emphasis in semiconductor technology is to create improved performance semiconductor devices at competitive prices. This emphasis over the years has resulted in extreme miniaturization of semiconductor devices, made possible by continued advances in semiconductor processes and materials in combination with new and sophisticated device designs. Large numbers of transistors are employed in integrated circuits (ICs) in many electronic devices. For example, components such as central processing units (CPUs), graphics processing units (GPUs), and memory systems each employ a large quantity of transistors for logic circuits and memory devices. Additionally, other elements (e.g., passive elements) such as trench capacitors may be implemented in ICs of electronic devices Trench capacitors are vertical semiconductor devices that are used to add capacitance to various ICs. An advantage of using trench capacitors over package capacitors is that trench capacitors can be freely placed as close as possible to the desired circuit. Additionally, trench capacitors provide higher capacitance per unit area over other solutions such as metal-insulator-metal (MIM) capacitors. Trench capacitors may be implemented, for example, in device memory, computational logic, and decoupling applications.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages described herein.

Certain aspects of the present disclosure provide a capacitor assembly. The capacitor assembly generally includes a first array of trench capacitors and a second array of trench capacitors. The second array of trench capacitors may be disposed adjacent to and electrically coupled to the first array of trench capacitors. Additionally, the second array of trench capacitors may be inverted with respect to the first array of trench capacitors.

Certain aspects of the present disclosure provide a stacked capacitor assembly. The stacked capacitor assembly generally includes a plurality of capacitor assemblies stacked vertically and electrically coupled together. At least one of the plurality of capacitor assemblies includes a first array of trench capacitors and a second array of trench capacitors. The second array of trench capacitors may be disposed adjacent to and electrically coupled to the first array of trench capacitors. Additionally, the second array of trench capacitors may be inverted with respect to the first array of trench capacitors.

Certain aspects of the present disclosure provide an integrated circuit (IC) assembly comprising a stacked capacitor assembly as described herein. The IC assembly further includes a package substrate, one or more dies disposed above the package substrate; and a plurality of solder balls disposed under the package substrate, wherein the stacked capacitor assembly is also disposed under the package substrate.

Certain aspects of the present disclosure are directed to a method for fabricating a capacitor assembly. The method generally includes forming a first array of trench capacitors, forming a second array of trench capacitors, inverting the second array of trench capacitors, disposing the inverted second array of trench capacitors adjacent to the first array of trench capacitors, and electrically coupling the first array of trench capacitors to the inverted second array of trench capacitors.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be made by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure relate to a trench capacitor array assembly and methods for fabricating the same.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Conventionally, plates (e.g., contacts) for a trench capacitor array may be placed on a top surface of the array. For example, the trench capacitors of the array may be oriented in the same direction, and the ports of the trench capacitor array may be implemented on the same surface of the array. Thus, the design of trench capacitor arrays makes it difficult to stack the capacitor arrays.

Accordingly, certain aspects of the present disclosure provide a capacitor assembly with ports implemented on both top and bottom surfaces of the capacitor assembly. As a result, a higher density of capacitors may be implemented in a given area by allowing multiple capacitor assemblies to be stacked in an efficient manner. The stacked capacitor assembly may be used as an alternating-current (AC) decoupling capacitor in some implementations.

Figure 1:
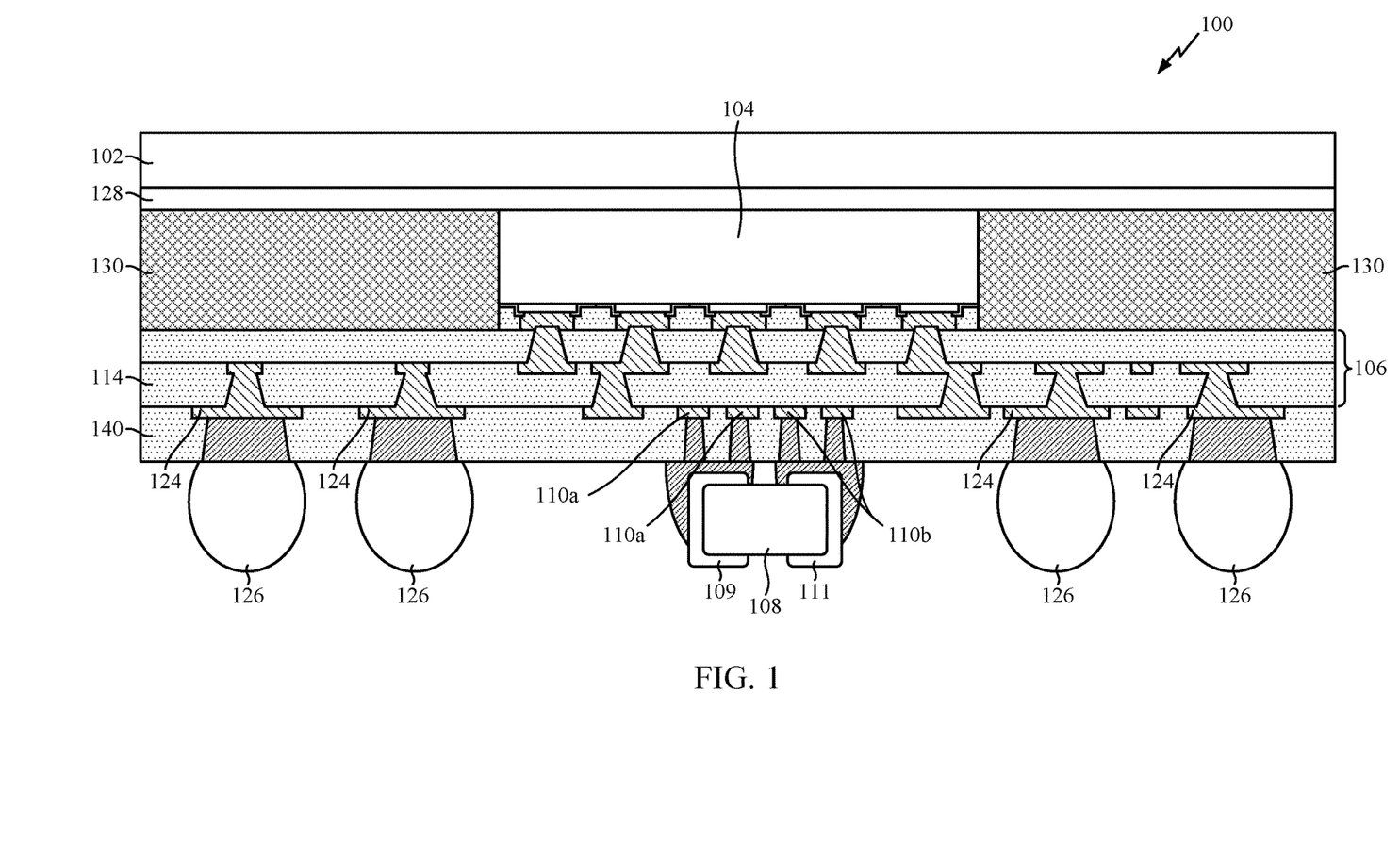
FIG. 1 is a cross-sectional view of an example chip package.

FIG. 1 is a cross-sectional view of an example chip package 100, in which certain aspects of the present disclosure may be implemented. As shown, the chip package 100 may include a chip carrier 102, a die 104, one or more redistribution layers 106, an electrical component 108, and conductive pads 110a, 110b (collectively referred to herein as "conductive pads 110"). The chip package 100 may be, for example, a fan-out wafer level package.

Under-bump conductors 124 (e.g., under-bump metallization (UBM) pads) may be disposed on the same layer 114 of the redistribution layers 106 as the conductive pads 110. Solder balls 126 may be disposed on the under-bump conductors 124. The solder balls 126 may enable the chip package 100 to be mounted to external circuitry, such as a circuit board.

The chip package 100 may also include a conductive layer 128 disposed between the die 104 and the chip carrier 102. The conductive layer 128 may be conductive shielding, such as a ground plane or a conductive foil (e.g., copper foil). In certain aspects, the conductive layer 128 may be a heat spreader that dissipates heat from the die 104.

The chip carrier 102 may provide a structure for packaging the die 104 at the wafer level and post-fabrication. The chip carrier 102 may be, for example, a glass carrier or silicon carrier. The chip carrier 102 may be removed or thinned after fabricating the chip package 100. The die 104 may be encapsulated in the chip package 100 by a molding compound 130. The molding compound 130 may be an epoxy resin, for example.

One or more conductive pads 110a may couple to a first terminal 109 of the electrical component 108, and one or more other conductive pads 110b may couple to a second terminal 111 of the electrical component 108. The conductive pads 110 may be disposed on a layer 114 of the one or more redistribution layers 106. In certain aspects, the layer 114 may be a dielectric layer of the one or more redistribution layers 106. A layer of solder resist 140 may be disposed below the one or more redistribution layers 106.

The electrical component 108 may be a surface-mount electrical device coupled to the chip package 100 on the land side or die side. For instance, the electrical component 108 may be a passive surface-mount electrical device such as a capacitor, a capacitor assembly as further described herein (e.g., with respect to FIG. 3A), an inductor, or a resistor. As shown in this example, the electrical component 108 is coupled to the chip package 100 on the land side, as opposed to the die side, of the redistribution layers 106. Although only one electrical component 108 is illustrated in FIG. 1, the chip package 100 may include multiple electrical components 108, which may be the same or different types.

Example Trench Capacitor Array

Figure 2A:
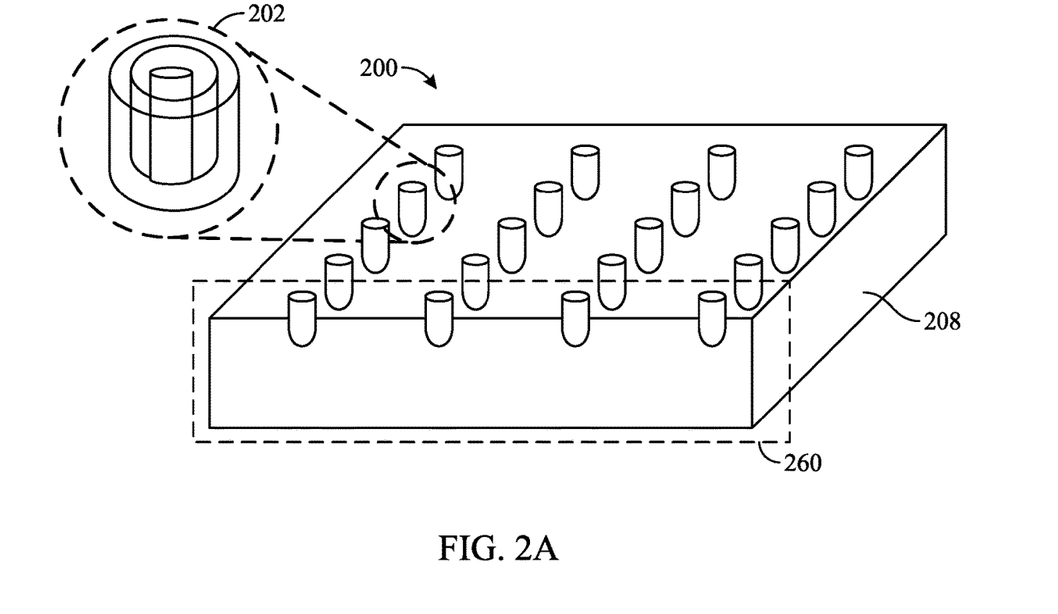
FIGS. 2A-2C illustrate an example trench capacitor array.
Figure 2B:
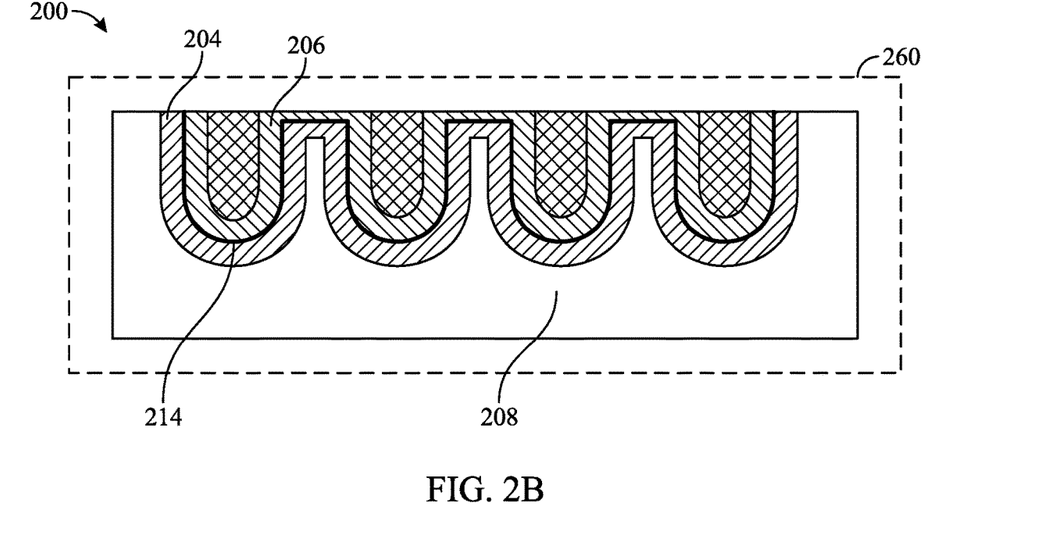

FIG. 2A illustrates a trench capacitor array 200. As illustrated in FIG. 2A, the trench capacitor array 200 may include trench capacitors (e.g., trench capacitor 202) formed in a substrate 208. FIG. 2B illustrates a cross section through a row of trench capacitors 260 of the trench capacitor array 200. As shown, each of the trench capacitors 260 may include a first electrode 204 and a second electrode 206. Furthermore, dielectric material 214 may be disposed between the first electrode 204 and the second electrode 206.

Figure 2C:
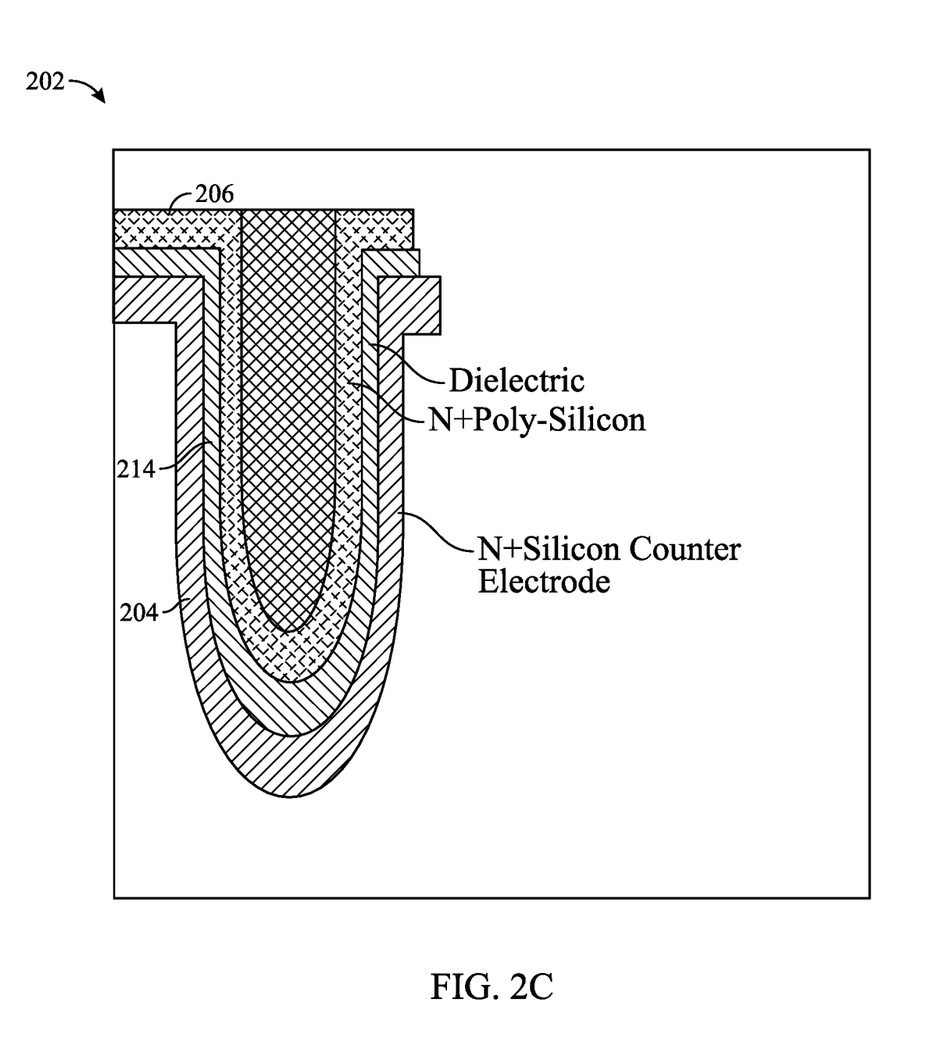

FIG. 2C illustrates a cross section of the trench capacitor 202. As described, the trench capacitor 202 includes the first electrode 204 and the second electrode 206. As illustrated, dielectric material 214 may be disposed between the first electrode 204 and the second electrode 206. As shown, the first electrode 204 may be implemented using N+ polysilicon material, or any suitable material. The second electrode 206 may be implemented using N+ silicon material, or any suitable material.

Example Capacitor Assembly of Multiple Trench Capacitor Arrays

As described herein, the traditional construction of trench capacitor arrays makes it difficult to stack the capacitor arrays. For example, the ports for the electrodes of the capacitor array may be located only on the top surface of the trench capacitor array (e.g., on the same surface as the trench capacitors) making it difficult to stack multiple capacitor arrays, especially when stacking more than two capacitor arrays. Accordingly, certain aspects of the present disclosure provide a capacitor assembly implemented using multiple capacitor arrays, the capacitor assembly having inverted trench capacitor arrays and having ports on both top and bottom surfaces of the capacitor assembly such that the capacitor assemblies may be stacked. In other words, using the contacts on the top and bottom surfaces of each capacitor assembly, the capacitor assemblies may be stacked to form a capacitive element with a higher capacitance as compared to the capacitance of each capacitor assembly, as described in more detail herein.

Figure 3A:
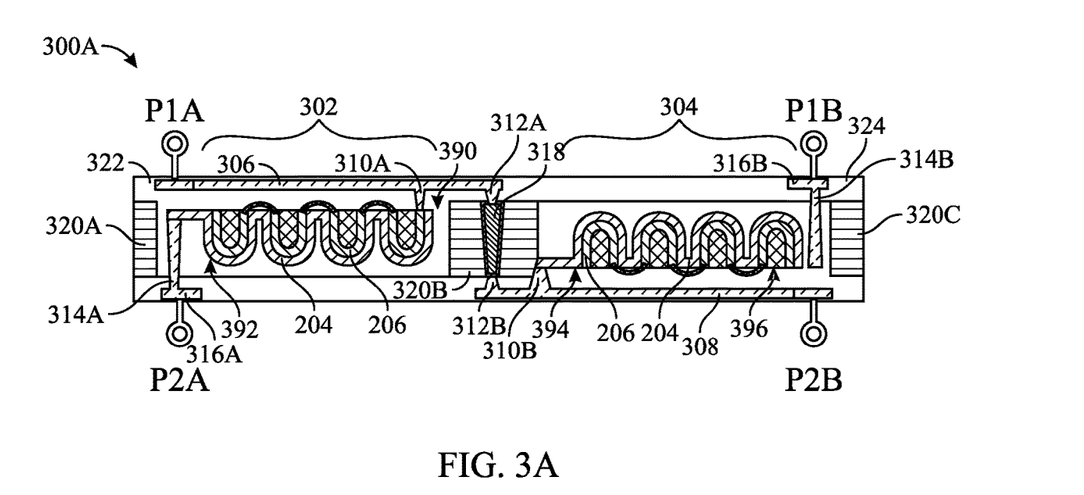
FIGS. 3A and 3B illustrate a capacitor assembly and a representative circuit diagram, respectively, in accordance with certain aspects of the present disclosure.

FIG. 3A is a cross-sectional view of a capacitor assembly 300A, in accordance with certain aspects of the present disclosure. As shown, the capacitor assembly 300A may include a capacitor array 302 of trench capacitors and a capacitor array 304 of trench capacitors disposed adjacent to the capacitor array 302. The capacitor array 302 may have the same or a different number of trench capacitors as the capacitor array 304. Although four trench capacitors are shown for a row in each capacitor array 302, 304, it is to be understood that there may be more or less than four trench capacitors per row and that since this is a cross-sectional view, there may be trench capacitors in front of and/or behind the row of trench capacitors shown in FIG. 3A. The capacitor array 304 may be inverted with respect to the capacitor array 302, as shown, such that the trench capacitors of capacitor array 302 face upward and the trench capacitors of capacitor array 304 face downward in the capacitor assembly 300A. The trench capacitors of the capacitor arrays 302, 304 may be disposed in substrates 322, 324, respectively. In certain aspects, each of the capacitor array 302 and the capacitor array 304 may be of similar construction to the trench capacitor array 200 of FIG. 2B. Furthermore, the capacitor assembly 300A may include vias and traces to facilitate electrical connection between the capacitor arrays 302, 304, as described in more detail herein.

In certain aspects, the trench capacitors of the capacitor array 302 may be disposed between the moldings 320A, 320B, and the trench capacitors of the capacitor array 304 may be disposed between the moldings 320B, 320C, as illustrated. Furthermore, a through-molding via (TMV) 318 may extend through the molding 320B to provide electrical coupling between the capacitor arrays 302, 304, as further described herein. The moldings 320A, 320B, 320C may comprise a resin or any other suitable material. The TMV 318 may comprise copper, or any other suitable electrically conductive material.

As illustrated, the substrates 322, 324 may include traces and vias for providing electrically coupling between capacitor arrays and ports. For example, the substrate 322 of the capacitor array 302 may include a trace 306 and a via 310A that provide electrical coupling between port P1A and the trench capacitor 390 of the capacitor array 302. The substrate 322 may also include a trace 316A and a via 314A that provide electrical coupling between port P2A and the trench capacitor 392. As illustrated, the capacitor assembly 300A may include a via 312A coupled between the trace 306 and the TMV 318. As illustrated, port P1A is implemented on a top surface of the capacitor assembly 300A, while port P2A is implemented on a bottom surface of the capacitor assembly 300A.

Furthermore, the substrate 324 of the capacitor array 304 may include a trace 308 and a via 310B that provide electrical coupling between port P2B and the trench capacitor 394 of the capacitor array 304. The substrate 324 may also include a trace 316B and a via 314B that provide electrical coupling between port P1B and the trench capacitor 396. As illustrated, the capacitor assembly 300A may include a via 312B coupled between the trace 308 and the TMV 318. As illustrated, port P1B is implemented on a top surface of the capacitor assembly 300A, while port P2B is implemented on a bottom surface of the capacitor assembly 300A.

In certain aspects, the capacitor array 302 may effectively form a first capacitive element with ports P1A and P2A functioning as the ports of the first capacitive element. Additionally, the capacitor array 304 may effectively form a second capacitive element that is in parallel with the first capacitive element formed by the capacitor array 302, with ports P2B and P1B functioning as the ports of the second capacitive element.

Figure 3B:
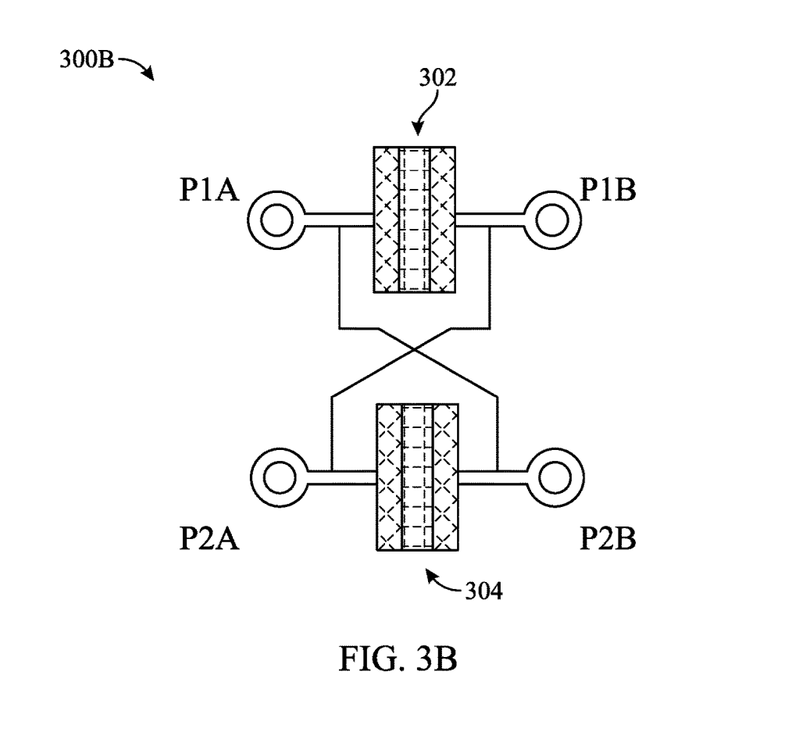

As illustrated in the circuit configuration 300B of FIG. 3B, port P1A may be coupled to port P2B using the TMV 318, as described. Although not shown in FIG. 3A, port P1B may be coupled to port P2A. As illustrated, the capacitive elements formed by capacitor arrays 302, 304 are in parallel such that the total capacitance of the capacitor assembly is equal to the sum of the capacitance of each of the capacitor arrays 302, 304.

Figure 4A:
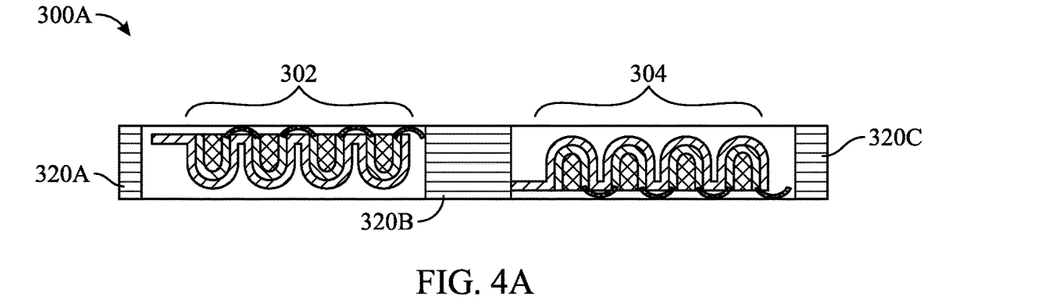
FIGS. 4A-4D illustrate example operations for fabrication of a capacitor assembly, in accordance with certain aspects of the present disclosure.

FIGS. 4A-4D illustrate example operations for fabrication of the example capacitor assembly 300A, in accordance with certain aspects of the present disclosure. A fabrication facility may form the capacitor arrays 302, 304. For example, as shown in FIG. 4A, the capacitor array 302 and the capacitor array 304 may be disposed adjacent to one another, with the capacitor array 304 being inverted relative to the capacitor array 302.

Figure 4B:
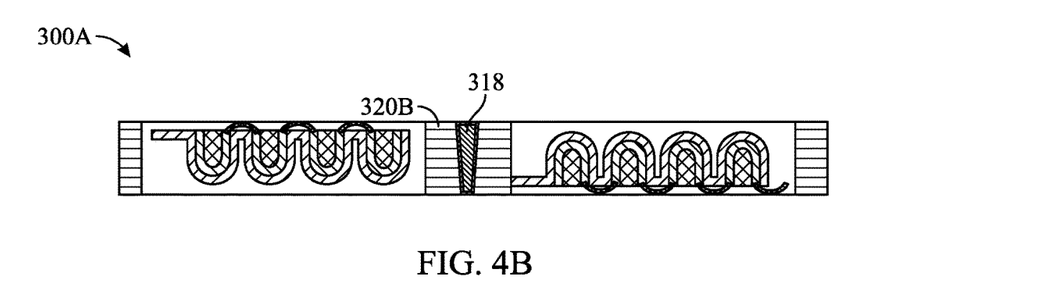

Furthermore, the capacitor assembly 300A may be formed such that the trench capacitors of the capacitor array 302 are disposed between the moldings 320A, 320B, and the trench capacitors of the capacitor array 304 are disposed between the moldings 320B, 320C, as illustrated. As shown in FIG. 4B, the molding 320B may be processed (e.g., etched) to form a gap within which the TMV 318 may be formed (e.g., by deposition). In certain aspects, the TMV 318 may comprise copper or any other suitable conductive material.

Figure 4C:
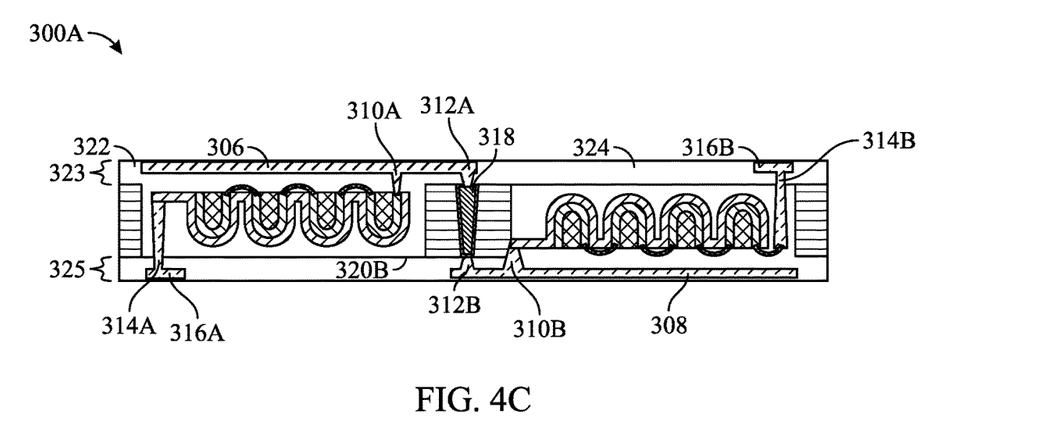

As shown in FIG. 4C, layers of dielectric 323, 325 may be formed, as illustrated. Furthermore, the traces 316A, 306, 308, and 316B, and vias 314A, 310A, 312A, 312B, 310B, and 314B may be formed to provide electrical coupling for the trench capacitors of the capacitor arrays, as described herein. For certain aspects, the traces 316A, 306, 308, and 316B may be formed in the respective dielectric layers 323, 325, and then these dielectric layers may be applied to the upper and lower surfaces of the workpiece with the adjacent trench capacitor arrays 302, 240.

Figure 4D:
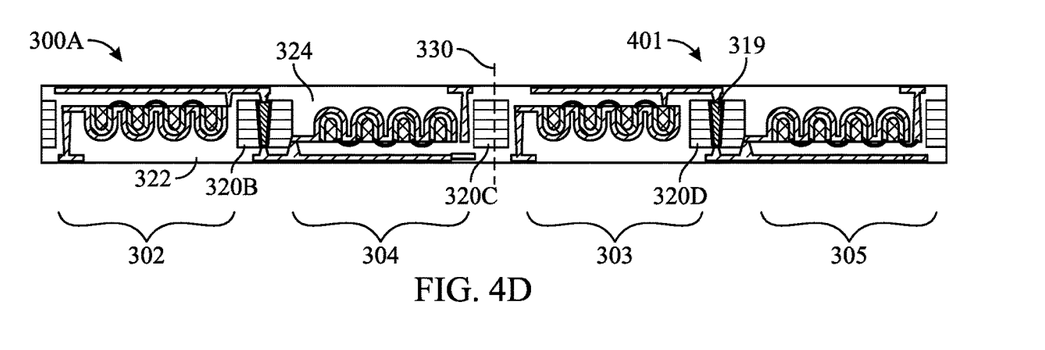

In some aspects, multiple capacitor assemblies may be formed adjacent to one another on a wafer, and later separated so that the capacitor assemblies can be stacked. For example, as illustrated in FIG. 4D, a capacitor assembly 401 may be formed adjacent to the capacitor assembly 300A and in the same or similar fashion as the capacitor assembly 300A. That is, the capacitor assembly 401 may include a capacitor array 303 and a capacitor array 305, disposed and formed in a similar fashion as the capacitor array 302 and the capacitor array 304. Furthermore, the capacitor assembly 401 may include traces, contacts, vias (e.g., the TMV 319), and molding (e.g., the molding 320D) similar to those of the capacitor assembly 300A. In certain aspects, the capacitor assembly structure having the capacitor arrays 302, 303, 304, 305 may be diced along the line 330 to form two separate capacitor assemblies, as illustrated. The separated capacitor assemblies may be stacked, as described herein.

In certain aspects, the capacitor assemblies described herein may be formed using two capacitor arrays diced from the wafer(s) with one capacitor array being arranged (e.g., inverted with respect to the other capacitor array) to form a reconstituted wafer, and using a molding applied between the individual capacitor arrays on the reconstituted wafer. That is, dies may be placed in opposite orientations adjacent to one another, allowing for there to be contacts on both the top and the bottom of the capacitor assembly, as shown and described herein. Thus, by taking advantage of the contacts on the top and bottom of the capacitor assembly, the capacitor assemblies may be stacked, as shown and described further with respect to FIG. 6.

Figure 5:
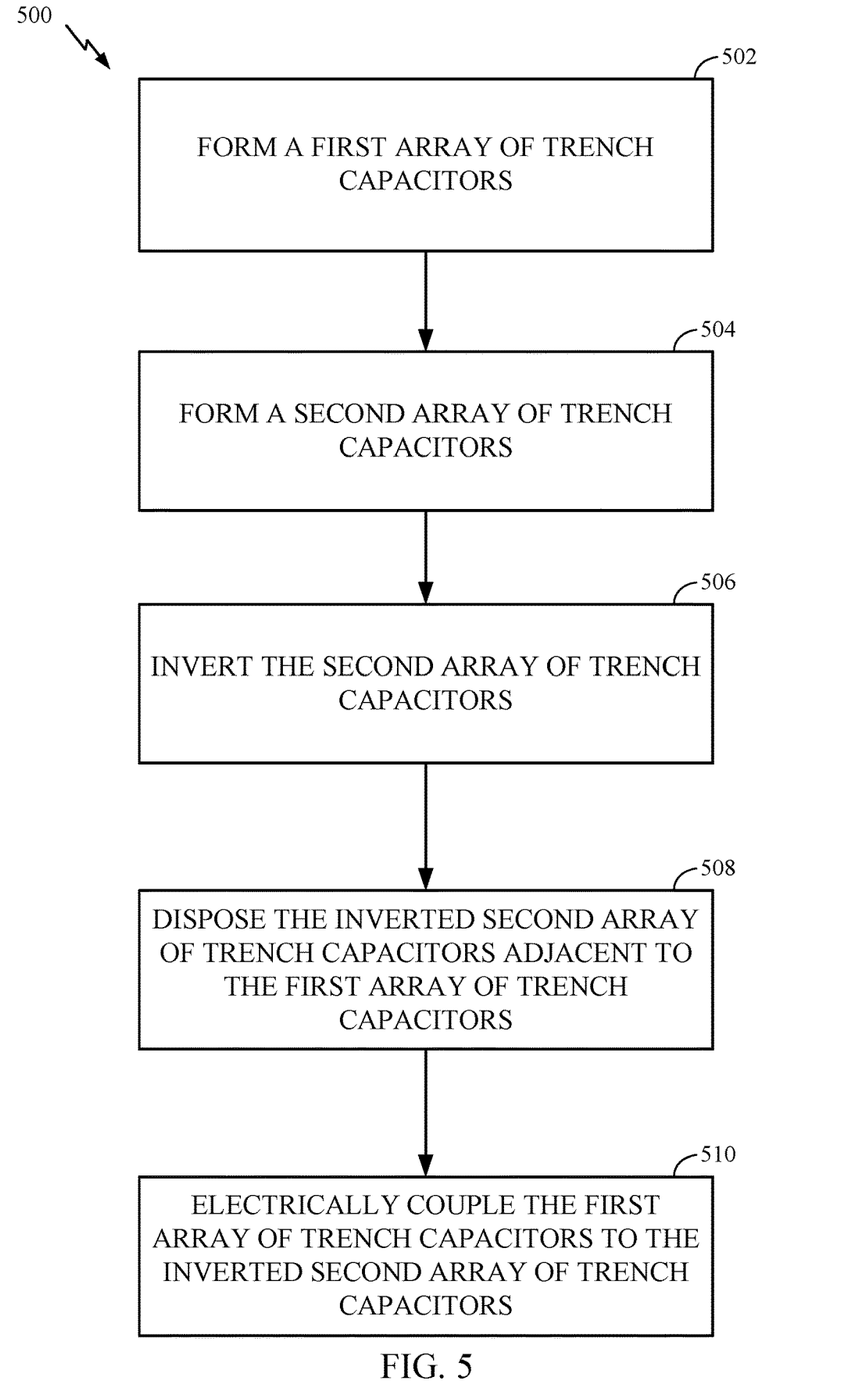
FIG. 5 is a flow diagram illustrating exemplary operations for fabricating a capacitor assembly, in accordance with certain aspects of the present disclosure.

FIG. 5 is a block diagram of example operations 500 for fabricating a capacitor assembly (e.g., the capacitor assembly 300A depicted in FIG. 3A), in accordance with certain aspects of the present disclosure. The operations 500 may be performed by a semiconductor fabrication facility (e.g., a foundry).

The operations 500 may begin at block 502 with the fabrication facility forming a first array of trench capacitors (e.g., the capacitor array 302) and at block 504 with the fabrication facility forming a second array of trench capacitors (e.g., the capacitor array 304). At block 506, the fabrication facility inverts the second array of trench capacitors (e.g., with respect to the first array). At block 508, the fabrication facility disposes the inverted second array of trench capacitors adjacent to the first array of trench capacitors. At block 510, the fabrication facility electrically couples (e.g., via the TMV 318) the first array of trench capacitors to the inverted second array of trench capacitors.

In certain aspects, the operations 500 may further involve the fabrication facility forming a third array of trench capacitors (e.g., the capacitor array 303) and disposing the third array of trench capacitors adjacent to the inverted second array of trench capacitors. The operations 500 may further entail the fabrication facility forming a fourth array (e.g., the capacitor array 305) of trench capacitors, inverting the fourth array of trench capacitors (e.g., with respect to the third array), and disposing the inverted fourth array of trench capacitors adjacent to the third array of trench capacitors. The third array of trench capacitors may be electrically coupled to the inverted fourth array of trench capacitors. Additionally, the fabrication facility may separate the first and second arrays of trench capacitors from the third and fourth arrays of trench capacitors (e.g., by dicing along the line 330).

In certain aspects, the fabrication facility may also apply a first molding (e.g., the molding 320B) between the first array of trench capacitors and the second array of trench capacitors, apply a second molding (e.g., the molding 320D) between the third array of trench capacitors and the fourth array of trench capacitors, and apply a third molding (e.g., the molding 320C) between the second array of trench capacitors and the third array of trench capacitors. In this case, the third molding may be diced to separate the first and second arrays of trench capacitors from the third and fourth arrays of trench capacitors.

Figure 6:
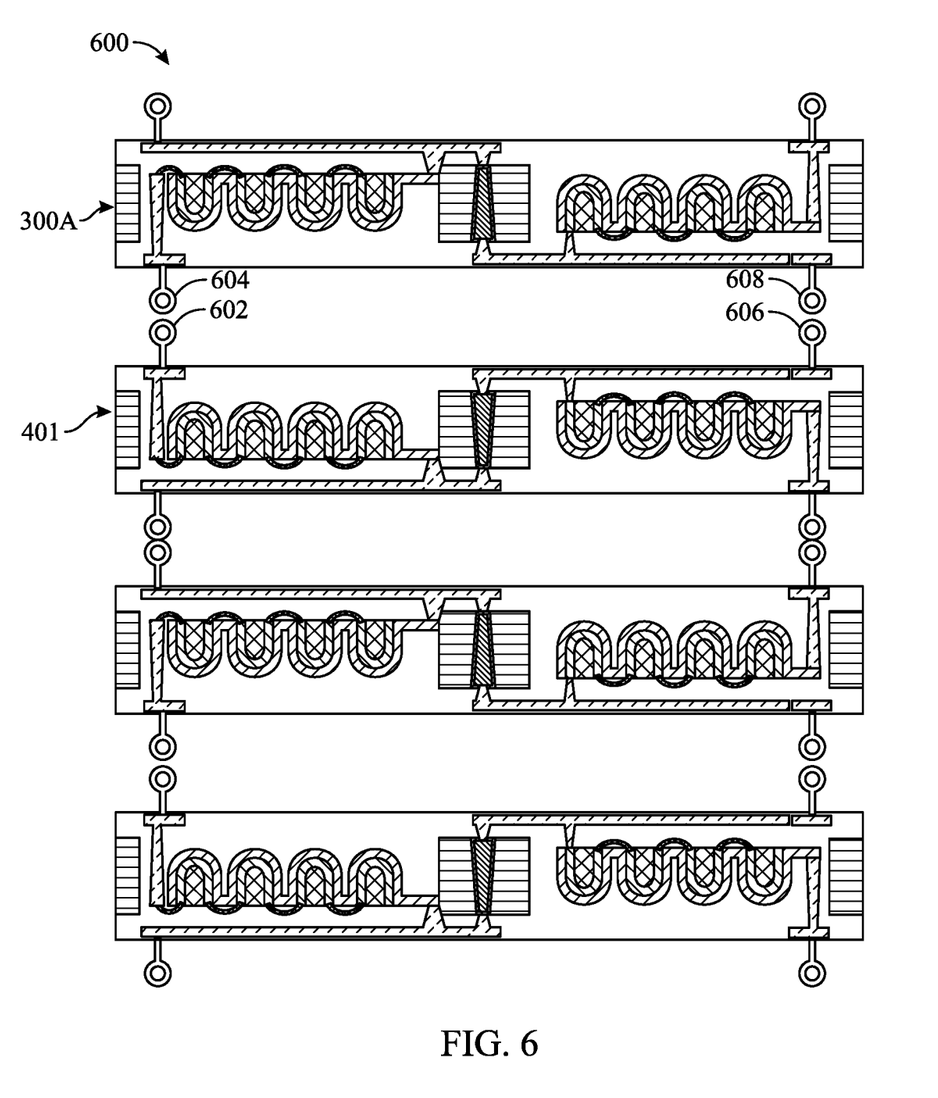
FIG. 6 is a cross-sectional view of a stacked capacitor assembly, in accordance with certain aspects of the present disclosure.

FIG. 6 is a cross-sectional view of a stacked capacitor assembly 600, in accordance with certain aspects of the present disclosure. As shown, a plurality of capacitor assemblies (e.g., the capacitor assembly 300A of FIG. 3A) may be stacked on top of one another. In particular, each capacitor assembly may be inverted with respect to each adjacent capacitor assembly disposed thereabove or therebelow. For example the capacitor assembly 300A may be oriented in a first orientation, and the capacitor assembly 401 may be oriented in a second orientation which is inverted relative to the first orientation of the capacitor assembly 300A. Furthermore, as shown, each capacitor assembly may be coupled to an adjacent capacitor assembly via respective ports. For example, port 602 of capacitor assembly 401 may be coupled to port 604 of capacitor assembly 300A, and port 606 of capacitor assembly 401 may be coupled to port 608 of capacitor assembly 300A. Thus, the stacked capacitor assembly 600 includes parallel coupled capacitive elements, each capacitive element implemented using a capacitor array. In other words, the stacked capacitor assembly 600 implemented using four capacitor assemblies effectively forms eight capacitive elements in parallel, each capacitive element being implemented by a capacitor array having multiple trench capacitors.

Figure 7:
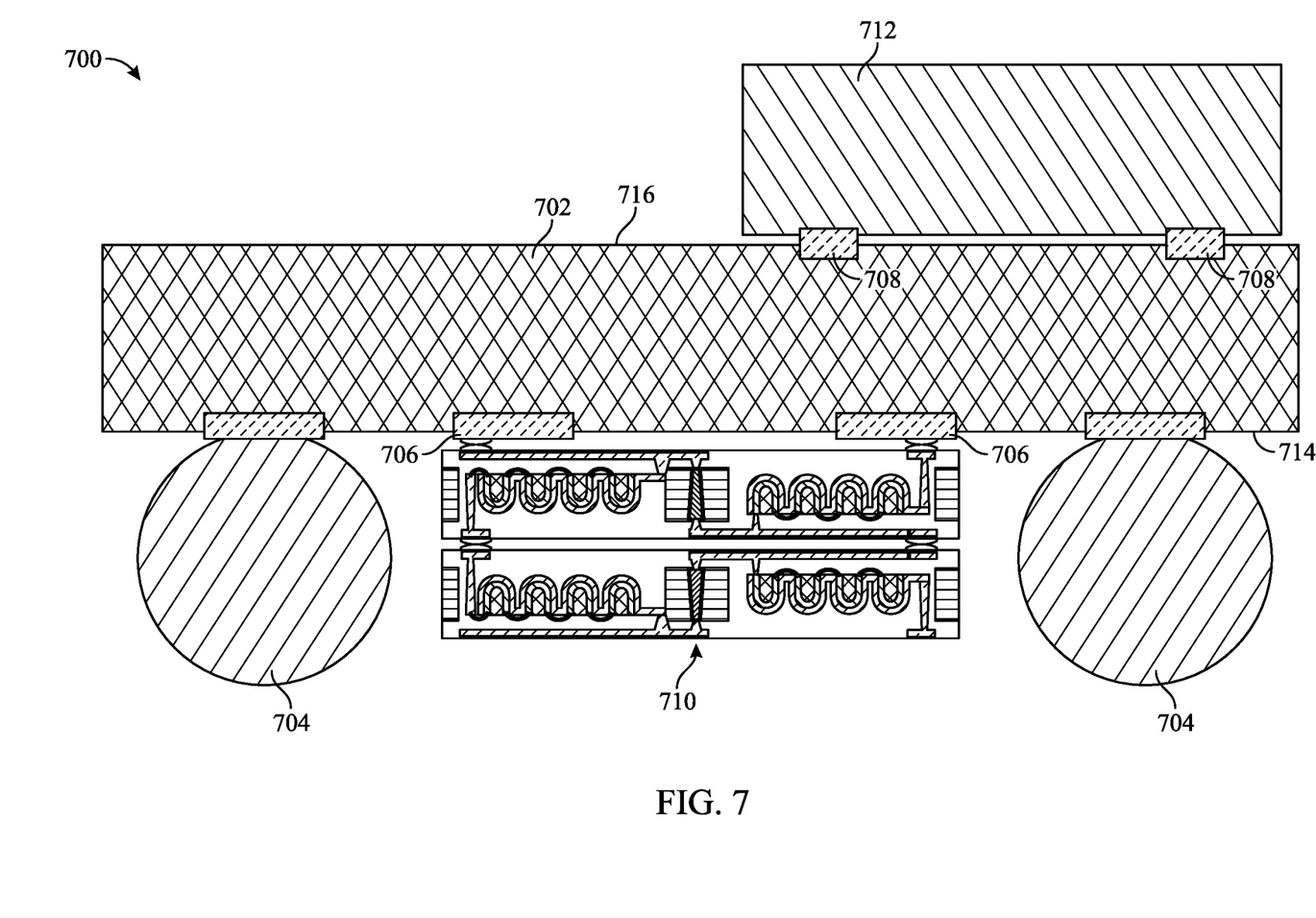
FIG. 7 is a cross-sectional view of an integrated circuit (IC) package with a stacked capacitor assembly disposed underneath a package substrate, in accordance with certain aspects of the present disclosure.

FIG. 7 is a cross-sectional view of an integrated circuit (IC) assembly 700 with a stacked capacitor assembly, in accordance with certain aspects of the present disclosure. As shown, the IC assembly 700 may include a package substrate 702, solder balls 704 disposed below the package substrate 702, one or more dies (e.g., die 712) disposed above the package substrate 702, and a stacked capacitor assembly 710 (e.g., corresponding to the stacked capacitor assembly 600 of FIG. 6) coupled to the package substrate 702. The die 712 may be coupled to the package substrate 702 by contacts 708 (e.g., copper pillars). In certain aspects, the stacked capacitor assembly 710 may be coupled to the package substrate 702 by contacts 706 on the bottom side 714 (the land side) of the package substrate 702 such that the stacked capacitor assembly 710 is between the solder balls 704. Alternatively or additionally, a stacked capacitor assembly may be coupled to the package substrate 702 on the top side 716 (the die side) of the package substrate 702. Furthermore, although the stacked capacitor assembly 710 is implemented with two capacitor assemblies, the stacked capacitor assembly 710 may include just one capacitor assembly, or more than two capacitor assemblies. In certain aspects, the stacked capacitor assembly 710 functions as a decoupling capacitor for the die 712.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A capacitor assembly comprising:
   a first array of trench capacitors; and
   a second array of trench capacitors disposed adjacent to and electrically coupled to the first array of trench capacitors, the second array of trench capacitors being inverted with respect to the first array of trench capacitors.

2. The capacitor assembly of claim 1, wherein the first array of trench capacitors is disposed in a first substrate and wherein the second array of trench capacitors is disposed in a second substrate, different from the first substrate.

3. The capacitor assembly of claim 1, wherein the trench capacitors in the first array are coupled in parallel to effectively form a first capacitive element having a first port and a second port.

4. The capacitor assembly of claim 3, wherein the trench capacitors in the second array are coupled in parallel to effectively form a second capacitive element having a first port and a second port.

5. The capacitor assembly of claim 4, wherein the first port of the first capacitive element is coupled to the first port of the second capacitive element and wherein the second port of the first capacitive element is coupled to the second port of the second capacitive element, such that the first capacitive element is coupled in parallel with the second capacitive element.

6. The capacitor assembly of claim 4, further comprising a molding disposed between the first array of trench capacitors and the second array of trench capacitors.

7. The capacitor assembly of claim 6, wherein the molding comprises a resin.

8. The capacitor assembly of claim 6, further comprising a through-molding via (TMV) disposed in the molding, wherein the TMV is coupled to the second port of the first capacitive element and to the second port of the second capacitive element.

9. The capacitor assembly of claim 1, further comprising:
   at least one first contact extending above a top surface of the capacitor assembly; and
   at least one second contact extending below a bottom surface of the capacitor assembly.

10. The capacitor assembly of claim 1, further comprising a first molding disposed between the first array of trench capacitors and the second array of trench capacitors.

11. The capacitor assembly of claim 10, further comprising at least one of:
   a second molding disposed at an end of the first array of trench capacitors furthest away from the second array of trench capacitors; or
   a third molding disposed at an end of the second array of trench capacitors furthest away from the first array of trench capacitors.

12. The capacitor assembly of claim 1, wherein the first array of trench capacitors and the second array of trench capacitors have a same number of trench capacitors.

\* \* \* \* \*